US010411720B2

United States Patent
Lenzen et al.

(10) Patent No.: US 10,411,720 B2
(45) Date of Patent: Sep. 10, 2019

(54) EFFICIENT AND DEPENDABLE CLOCK SYNCHRONIZATION IN HARDWARE

(71) Applicant: MAX-PLANCK-GESELLSCHAFT ZUR FÖRDERUNG DER WISSENSCHAFTEN E.V., München (DE)

(72) Inventors: Christoph Lenzen, Saarbrücken (DE); Matthias Függer, Cachan (FR); Attila Kinali, Saarbrücken (DE); Stephan Friedrichs, Saarbrücken (DE); Moti Medina, Saarbrücken (DE)

(73) Assignee: MAX-PLANCK-GESELLSCHAFT ZUR FÖRDERUNG DER WISSENSCHAFTEN E.V., Munich (DE)

( * ) Notice: Subject to any disclaimer, the term of this patent is extended or adjusted under 35 U.S.C. 154(b) by 0 days.

(21) Appl. No.: 16/006,498

(22) Filed: Jun. 12, 2018

(65) Prior Publication Data

US 2018/0351564 A1 Dec. 6, 2018

Related U.S. Application Data

(63) Continuation of application No. PCT/EP2016/002179, filed on Dec. 23, 2016.

(60) Provisional application No. 62/272,095, filed on Dec. 19, 2015.

(30) Foreign Application Priority Data

Dec. 23, 2015 (EP) .................................... 15202534

(51) Int. Cl.
*H03L 7/099* (2006.01)
*G04F 10/00* (2006.01)

(52) U.S. Cl.
CPC .......... *H03L 7/0995* (2013.01); *G04F 10/005* (2013.01)

(58) Field of Classification Search
CPC .... H03K 17/005; H03K 17/74; H03K 17/735; H03K 17/693; G04F 10/005; H03M 1/50; H03M 1/60; H03M 1/662
See application file for complete search history.

(56) References Cited

U.S. PATENT DOCUMENTS 4,593,390 A * 6/1986 Hildebrand .......... H03K 17/693
327/407
5,448,202 A * 9/1995 Owen .................... H03D 3/006
329/323
5,489,865 A * 2/1996 Colvin, Sr. .......... H03K 3/0375
326/94

(Continued)

FOREIGN PATENT DOCUMENTS

WO WO2012137109 1/2014

OTHER PUBLICATIONS

WIPO, International Preliminary Report on Patentability Chapter I in PCT/EP2016/002179, dated Jun. 26, 2018 (7p.).

(Continued)

*Primary Examiner* — An T Luu
(74) *Attorney, Agent, or Firm* — Siritzky Law, PLLC

(57) ABSTRACT

The invention comprises a fault-tolerant clock synchronization method with high precision, hardware implementations thereof and the corresponding digital circuits, designed to contain metastability.

20 Claims, 14 Drawing Sheets

(56) References Cited

U.S. PATENT DOCUMENTS

| | | | |
|---|---|---|---|
| 6,417,709 B1 * | 7/2002 | Mizuhara | H03K 5/086 |
| | | | 327/175 |
| 9,973,178 B1 * | 5/2018 | Holzmann | H03K 5/00006 |
| 2014/0021356 A1 | 1/2014 | Zwaans et al. | |

OTHER PUBLICATIONS

WIPO, Written Opinion of the International Searching Authority in PCT/EP2016/002179, dated Jun. 29, 2017 (6p.).

WIPO International Search Report in PCT/EP2016/002179, dated Jun. 29, 2017 (3p.).

L. R. Marino, "General theory of metastable operation", IEEE Transactions on Computers, (Feb. 1981), vol. 30, No. 2, pp. 107-115.

J. Lundelius Welch; N. A. Lynch, "A new fault-tolerant algorithm for clock synchronization", Information and Computation, (1988), vol. 77, No. I, pp. 1-36.

* cited by examiner

Figure 1

| Algorithm 1: Synchronization algorithm, code for node $v$ |
|---|
| 1    // $H_w(0) \in [0, F)$ for all $w \in V$ |
| 2    wait until time $t_v(0)$ with $H_v(t_v(0)) = F$; |
| 3    foreach *round* $r \in \mathbb{N}$ do |
| 4        start listening for messages; |
| 5        wait for $\tau_1$ local time;    // all nodes are in round $r$ |
| 6        broadcast clock pulse to all nodes (including self); |
| 7        wait for $\tau_2$ local time;    // all messages arrived |
| 8        for *each node* $w \in V$ do |
| 9            $\tau_{vw} := H_v(t_{vw})$, with reception time $t_{vw}$ of first message from $w$ ($\tau_{vw} := \infty$ if no message received from $w$); |
| 10      $T_v := \{\tau_{vw} - \tau_{vv} \mid w \in V\}$ (as multiset); |
| 11      let $T_v^k$ denote the $k^{th}$ smallest element of $T_v$; |
| 12      $\delta_v \leftarrow \dfrac{T_v^{f+1} + T_v^{n-f}}{2}$;    // clock correction |
| 13      wait until time $t_v(r)$ with $H_v(t_v(r)) = H_v(t_v(r-1)) + T_R - \delta_v$; // round ends |

| dec | $O_1$ | $O_2$ | $O_3$ |
|---|---|---|---|
| 0 | 0 | 0 | 0 |
| 1 | 0 | 0 | 1 |
| 2 | 0 | 1 | 1 |
| 3 | 0 | 1 | 0 |
| 4 | 1 | 1 | 0 |
| 5 | 1 | 1 | 1 |
| 6 | 1 | 0 | 1 |
| 7 | 1 | 0 | 0 |

(a) 3-bit BRGC (b) Transformation circuit (Table III)**

| B | Circuit | # Gates | # Trans. | Delay |
|---|---|---|---|---|
| $B = 2$ | Exp. | 14 | 80 | 13 |
| | Poly. | 19 | 108 | 22 |
| $B = 4$ | Exp. | 118 | 664 | 25 |
| | Poly. | 98 | 552 | 60 |
| $B = 8$ | Exp. | 2486 | 13928 | 49 |
| | Poly. | 436 | 2448 | 136 |
| $B = 16$ | Exp. | 655222 | 3669256 | 87 |
| | Poly. | 1832 | 10272 | 288 |

Figure 18 b
(Table IV)

| B | Circuit | 4-sort | | 7-sort | | 10-sort | |
|---|---|---|---|---|---|---|---|
| | | #Gates | #Trans. | #Gates | #Trans. | #Gates | #Trans. |
| B = 2 | Exp. | 65 | 370 | 179 | 1010 | 311 | 1750 |
| | Poly. | 95 | 540 | 304 | 1728 | 551 | 3132 |
| B = 4 | Exp. | 535 | 2990 | 1393 | 7654 | 2377 | 12986 |
| | Poly. | 490 | 2760 | 1568 | 8832 | 2842 | 16008 |
| B = 8 | Exp. | 11195 | 62230 | 28661 | 156158 | 48629 | 263122 |
| | Poly. | 2180 | 12240 | 6976 | 39168 | 12644 | 70992 |
| B = 16 | Exp. | 2948515 | 16380710 | 7535197 | 41017966 | 12777133 | 69062594 |
| | Poly. | 9160 | 51360 | 29312 | 164352 | 53128 | 297888 |

Figure 24

| bits | 4-sort | | | 7-sort | | | 10-sort | | |
|---|---|---|---|---|---|---|---|---|---|
| | [4] | we | saved | [4] | we | saved | [4] | we | saved |
| 2 | 540 | 240 | 55.6% | 1728 | 768 | 55.6% | 3132 | 1392 | 55.6% |
| 4 | 4020 | 960 | 76.1% | 12864 | 3072 | 76.1% | 23316 | 5568 | 76.1% |
| 8 | 21060 | 3840 | 81.8% | 67302 | 12288 | 81.8% | 122148 | 22272 | 81.8% |
| 16 | 95400 | 15360 | 83.9% | 305472 | 49152 | 83.9% | 553068 | 89088 | 83.9% |

(a) $C^{MUX1}$         (b) $C^{CMUX1}$

11

(a) CMUX-A         (b) CMUX-B

EFFICIENT AND DEPENDABLE CLOCK SYNCHRONIZATION IN HARDWARE

RELATED APPLICATIONS

This application is a continuation of International application no. PCT/EP2016/002179, filed Dec. 23, 2016, the entire contents of which are hereby fully incorporated herein by reference for all purposes. Application no. PCT/EP2016/002179 claims priority from European application no. EP 15 202 534.2, filed Dec. 23, 2015 and U.S. application No. 62/272,095, filed Dec. 29, 2015, the entire contents of each of which are hereby fully incorporated herein by reference for all purposes.

The present invention relates to a method for synchronizing a number of clock pulses and metastability-containing circuits used therein.

TECHNICAL BACKGROUND AND PRIOR ART

In digital circuits, metastable signals have voltages strictly between logical 0 and logical 1, breaking the abstraction of Boolean logic. Unfortunately, any way of reading a signal from an unsynchronized clock domain or performing an analog-to-digital conversion incurs the risk of a metastable result; no physical implementation of a digital circuit can deterministically avoid, resolve, or detect metastability (L. R. Marino. General theory of metastable operation. IEEE Transactions on Computers, 30(2):107, 115, February 1981).

Traditionally, the only countermeasure is to write a potentially metastable signal into a synchronizer—a bistable storage element like a flip-flop—and wait. Synchronizers exponentially decrease the odds of maintained metastability over time, i.e., the waiting time determines the probability to resolve to logical 0 or 1. Accordingly, this approach delays subsequent computations and does not guarantee success.

A promising alternative is to run a fault-tolerant clock synchronization algorithm, like the one by Lynch and Welch (J. Lundelius Welch and N. A. Lynch. A new fault-tolerant algorithm for clock synchronization. Information and Computation, 77(1):1{36, 1988), preserving the benefits of multiple clock domains while removing the need for synchronizers.

The algorithm by Welch and Lynch is widely applied, e.g. in the Time-Triggered Protocol (TP) and FlexRay clock synchronization protocols. While the software/hardware based implementations of TTP and FlexRay achieve a precision in the order of one millisecond, higher operating frequencies ultimately require a pure hardware implementation.

All known implementations, however, synchronize potentially metastable inputs before computations—a technique that becomes less reliable with increasing operating frequencies, since less time is available for metastability resolution. Moreover, classical bounds for the Mean Time Between Failures (MTBF) for metastable upsets assume a uniform distribution of input transitions; this is not guaranteed to be the case in clock synchronization, since the goal is to align clock ticks. Either way, synchronizers do not deterministically guarantee stabilization, and errors are bound to happen eventually when n clocks take n(n−1) samples at, e.g., 1 GHz.

It is therefore an object of the present invention to provide a method and corresponding digital circuit for efficient and dependable clock synchronization in hardware that do not depend on metastability-free inputs and thus does not suffer from system failures induced by metastable upsets.

SHORT SUMMARY OF THE INVENTION

This object is achieved by a method and the circuits defined in the independent claims. Advantageous embodiments are defined in the dependent claims.

According to a first aspect, the invention comprises a method for synchronizing a number of clock pulses, comprising the steps: for each clock pulse, translating the incoming clock signal transitions to a binary value encoding the deviation from an expected arrival time; selecting first and a second binary value; calculating the average of these values and computing its difference to the expected value; and applying a corresponding phase correction or clock shift. The method may further comprise the step of correcting the frequency of one or more of the pulse signals. The incoming clock signal transitions may be translated by a multiplexed time-to-digital converter (TDC). Ring-oscillator TDCs may be used and a control bit may be used for indicating on which side of the oscillator ring the oscillator was halted by the incoming signal. A metastability-masking register may be used for the control bit. The two relevant signals may be selected before feeding the signals into the TDC, using a sorting network. Approximate frequency measurements may be obtained from a single measurement of phase differences. A node may be accelerated if it observes fewer then n−f signals in the local time window. The method may be coupled with a pulse synchronization method.

According to a second aspect, the invention further comprises a metastability-containing electronic circuit, usable for synchronizing a number of clock pulses, the circuit comprising: inputs, for receiving one or more electrical input signals; combinational logic for generating one or more electrical output signals, based on the one or more input signals; outputs, for outputting the one or more output signals; wherein the combinational logic generates at least one stable output signal (0, 1), based on at least one combination of stable and metastable input signals (0, 1, M). The combinational logic may be a multiplexer. An AND gate may check whether the inputs are equal and feed its result into an OR gate. A circuit sorting two B-bit gray code inputs with possibly one metastable bit each may be obtained by using a recursive approach whose size and depth are O(b2) and O(b) respectively. The combinational logic may select one of the input signals. At least two input signals may be clock pulses and at least one output signal represents a clock difference between the input signals. The combinational logic may encode the clock difference in a binary reflected Gray code (BRCG). At least one input signal may be delayed and the combinational logic generates the output signals, based on the delayed input signal. The combinational logic may be a sorting network. The circuit may further comprise a digitally controlled oscillator (DCO), controlled by at least one of the output signals. The digitally controlled oscillator may be used as a local clock. The digitally controlled oscillator may be a ring oscillator. The combinational logic may be implemented in a field programmable gate array (FPGA). Alternatively, the combinational logic may be implemented on the transistor level.

In a further aspect, the invention proposes and analyzes a novel TDC design that requires no analog components, i.e., is purely "digital". Moreover, it requires much fewer gates than a delay line TDC or Nutt interpolator of the same accuracy and maximum range. The TDC design supports high measurement frequencies. In most application scenarios, the maximum time between the starting and stopping signal will dominate the time required for one measurement. The quantization error is determined by the minimum time difference required for ensuring that concurrent sampling from two successive stages in a ring oscillator results in metastability of at most one of the respective latches. For 90 nm technology, such designs have been used to obtain an error of around 20 ps. It supports both multisampling (i.e., multiple measurements w.r.t. the same starting signal) and direct measurement of the time difference between two remote signals. Metastability resolution happens after reading the TDC. The TDC output is such that the measurement values can be copied elsewhere, giving them time to resolve in memory. Possible resolutions are shown to be consistent and not loose precision. This implies that the TDC is adaptive in the sense that one may choose the time span allocated to metastability resolution for the measurement values without affecting the TDC size or preventing its reuse for another measurement.

DESCRIPTION OF THE FIGURES

These and other aspects of the present invention are explained in more detail in the following detailed description of various embodiments of the invention, in connection with the drawing, in which FIG. 1: shows an algorithm (in pseudocode) for synchronizing clock pulses according to an embodiment of the invention.

FIG. 18 *a*: (Table III) is a summary of cost and delay of the implementations of 2-sort(B) given in theorem V.5 (Exp.) and Thm. V1.4 (Poly.).

FIG. 18 *b*: (Table IV) lists a gate and transistor counts for metastability-containing sorting networks with n∈{4,7,10} B-bit inputs derived from the implementations of 2-sort(B)

FIG. 19.

FIG. 24: Transistors saved when using CMUX-B.

DETAILED DESCRIPTION

Figure 2:
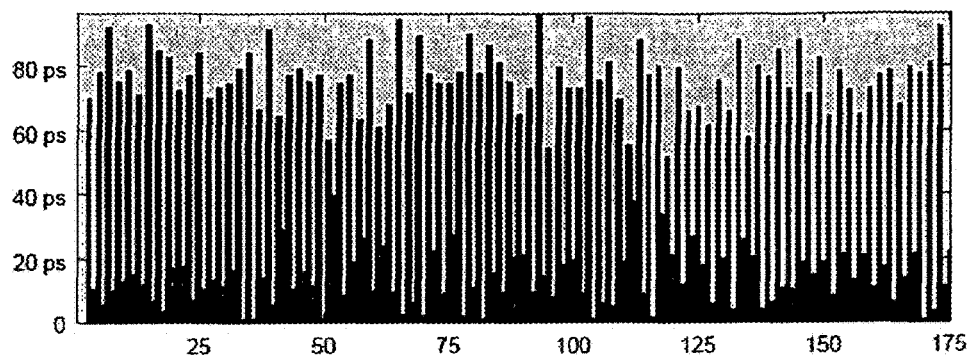
FIG. 2: shows a histogram of the encoded TDL output values during offline calibration. These values correspond to the bin sizes of the delay line.

FIG. 1 shows an algorithm (in pseudocode) for synchronizing clock pulses according to an embodiment of the invention.

The system in which the algorithm may operate is assumed to consist of a set V of n nodes that are fully connected by (1-bit) broadcast channels. Each node v∈V is a fault-containment region: a single (physical) fault, such as a gate malfunction, does not directly affect correctness of the components outside the fault-containment region that contains the faulty component. Node v comprises a local physical clock $H_v$ (e.g. a ring oscillator), the circuitry implementing the algorithm's logic for υ, and its outgoing links. This means that communication does not use a shared bus, which would be a single point of failure. Any potential application logic clocked by υ will be part of its fault containment region as well. Thus, any transient or permanent faults of components (in the fault-containment region) of $v$ affect other nodes only indirectly via communication. A faulty node (i.e., one whose containment region contains faulty components) can behave arbitrarily; in particular, it may send a clock pulse to a subset of the nodes only and at different times. It is assumed that at most $f = \lfloor (n-1)/3 \rfloor$ nodes are faulty; the set of correct nodes is referred to as $C \subseteq V$.

Nodes in C communicate by broadcasts. If $v \in C$ broadcasts at time $t_v$, any other correct node $w \in C$ has received and processed the respective pulse at some time $t_{w,v} \in [t_v + d - U, t_v + d]$, where d is the maximum delay and U is the delay uncertainty. For faulty senders in $V \setminus C$, such restrictions are irrelevant, as they may deviate from the protocol in an arbitrary way, i.e., send pulses at arbitrary times and independently to different receivers.

A correct node measures the time of arrival of other nodes' pulses relative to the time of arrival of its own pulse of the same round (cf. Algorithm 1). This is done by looping the broadcast signal back and using time-to-digital converters (TDCs) to determine the respective time difference. (cf. Section III-B). One assumes a one-sided worst-case measurement error of our TDCs when comparing signals arriving at times t and t' that fulfills $e(|t-t'|) = G + v|t-t'|$, where G is the granularity of the TDC (i.e., its discretization error) and $v \ll 1$ is the maximum relative deviation of the frequency of the TDC's time reference from its nominal frequency.

A node $v$ has no access to real-time, but only to its local clock $H_v: \Re_0^+ \to \Re_0^+$, where $H_v(t)$ is the local clock value at real-time t. For the purpose of a straightforward presentation of the algorithm, it is assumed that $$\forall t, t' \in \Re_0^+, t \rangle t': t - t' \leq H_v(t) - H_v(t') \leq v(t-t'),$$

where $v < 1$ is a constant close to 1, describing the frequency offset uncertainty of the local clock. For the sake of simplicity, we set $v = v^{-1}$ in the following, i.e., the clock source of a node and its TDCs have the same worst-case phase drift. It is assumed that $H_v(0) \in [0, F)$ for all $v \in C$, where F is determined by the precision of the booting process. For better readability, real-times are denoted with t and local times with $\tau$, with respective indices.

Each node $v \in V$ starts round $r \in N$ at time $t_v(r-1)$, where $t_v(0) = F$, and ends round r at $t_v(r)$. To fully specify the algorithm, one needs to determine $\tau_1$, $\tau_2$, and $T_R$. The following conditions are sufficient for the algorithm to work as intended.

$$\tau_1 \geq vF$$

$$\tau_2 \geq v(F + \tau_1 + d)$$

$$T_R \geq v(\tau_1 + F + U) + \tau_2 + t_{comp} + G,$$

where $t_{comp}$ is the time required to compute and apply the phase correction. It is desirable to keep the round length $T_R$ small, unless one seeks to lower the communication frequency. Since any values satisfying these inequalities are acceptable, one may always round up to the next integer multiple of the cycle time of the oscillators controlling the logic, i.e., no constraints on oscillator frequencies are needed. The minimal feasible choices result in a steady-state skew of $E \approx 4(U+G)$ for $v - 1 \ll 1$. The algorithm can handle frequency offsets of up to $v - 1 \approx 1\%$ without dramatic impact on E.

In a preferred embodiment, the above-described method may be modified to address the case that n-f nodes are synchronized, but an additional node is out-of-sync (possibly after a transient fault) and attempts to resynchronize. The modification to the algorithm is that, whenever a node receives fewer than n-f signals while listening for them in a given round, it will cut this round short. Thus, it quickly catches up with the main field.

Under slightly more conservative constraints on $\tau_1$, $\tau_2$, and $T_R$, this results in resynchronization in a constant number of rounds. However, this requires that an implementation (i) makes sure that indeed a node starts executing the next round within a time bounded by the maximum round duration, regardless of the content of its volatile memory, and (ii) it does not introduce any variables whose values are carried over to the next round.

The algorithm described in connection with FIG. 1 was implemented on four Cyclone IV FPGA development boards. An additional board was designed to carry the clock oscillator for the FPGA and the connectors for the coaxial cables between the nodes. In order to allow corrections of the pulse position with sub-clock cycle granularity, phase shifts were applied using a voltage controlled crystal oscillator (VCXO), which supplies the reference frequency for the PLL within the FPGA. The nodes are connected to each other using coaxial cables of the same length (ca. 30 cm), one for each pair of nodes and direction. The FPGA implements four state of the art TDCs to measure the timing of the incoming pulses, implements the logic of the algorithm, and controls the VCXO. An additional pulse output is available for measurements.

Due to limitations of the development board, pulses use 3:3V LVCMOS signaling. The resulting reflections slightly add to the measurement uncertainties. Furthermore, the FPGA development board only provides two pins for ground connection. This resulted in an involuntary test of the algorithm's fault-tolerance properties: having many high-speed signals over the same connector, the setup suffered from significant ground bounce of up to 200 mV between the ground potentials of the development board and the interface board; this caused one of the nodes to lose several clock ticks during our experiments.

The FPGA was clocked with 130 MHz derived from a 20 MHz VCXO on the interface board. As discussed above, to achieve sub-cycle length (i.e. smaller than 7:7 ns) corrections of the phase of the pulse, one controls the reference oscillator's output frequency. This was implemented using a 16-bit, 1 Msps DAC with SPI interface. This design choice imposed two important restrictions on our implementation. First, the oscillator's modulation bandwidth of about 10 kHz imposes a lower bound on the round length, as one needs to allow for sufficient time for the oscillator to respond to a changed control input. Therefore, a fairly large round length of $T_R = 50$ µs was chosen, of which 40 µs are allocated for shifting the clock phase.

Second, the tuning range of the oscillator is roughly 10 ppm, limiting the phase correction per round to $\approx 400$ ps. This is smaller than the duration of clock cycle of the FPGA ($\approx 7.7$ ns), preventing a simple implementation of larger phase shifts by enabling to adjust the (integral) number of clock cycles per round. Fortunately, the convergence analysis shows that the algorithm achieves the same steady-state error with this limitation on phase corrections. However, the number of rounds required for recovering nodes to resynchronize is much larger; with a frequency correction of at most 10 ppm, this takes up to about 105 rounds, yielding a worst-case bound on the time to recover in the order of seconds.

The performance-critical parameters from the setup are:
As discussed above, one has $G \leq 160$ ps for the TDC.

The differences in wire delays on the development and interface boards were calibrated using the TDCs. This results in an uncertainty of $U \leq G+40$ ps $\leq 200$ ps, where 40 ps is an estimated upper bound on the delay variations in equivalent paths between the TDCs.

a frequency deviation between one pair of oscillators of <1.5 ppm was measured. The manufacturer lists a typical frequency deviation including initial deviation and over temperature range of typical 3 ppm, i.e., $\upsilon - 1 \approx 3 \cdot 10^{-6}$.

Inserting these values into the bound obtained from the analysis, the estimated worst-case clock skew without faults is $2(G+U)+(\upsilon-1)T_R=870$ ps, where $T_R=50$ µs is the nominal duration of a round. With faults, this becomes $4(G+U)+2(\upsilon-1)T_R=1740$ ps.

Measurements are taken by a WaveCrest DTS-2075, which has a single-shot accuracy of ±25 ps and calibrated the input port skew to achieve better than 2 ps accuracy. To rule out any spurious effects from the instrument, two Stanford Research SR620 were used to verify these bounds.

FIG. 2 shows a histogram of the encoded TDL output values during offline calibration. These values correspond to the bin sizes of the delay line.

Figure 3:
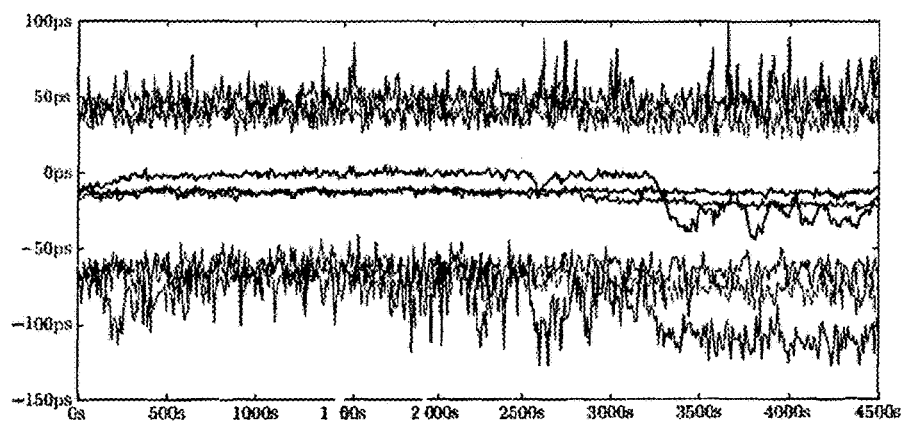
FIG. 3: shows a long-term evolution of the clock skew of three nodes against the same reference node over a period of an hour, measured sequentially. The thick lines depict the average clock skew over 10 s, the light yellow colored fill with the thin lines depict the minimum and maximum in the same interval.

FIG. 3 shows a long-term evolution of the clock skew of three nodes against the same reference node over a period of an hour, measured sequentially. The thick lines depict the average clock skew over 10 s, the light yellow colored fill with the thin lines depict the minimum and maximum in the same interval.

Figure 4:
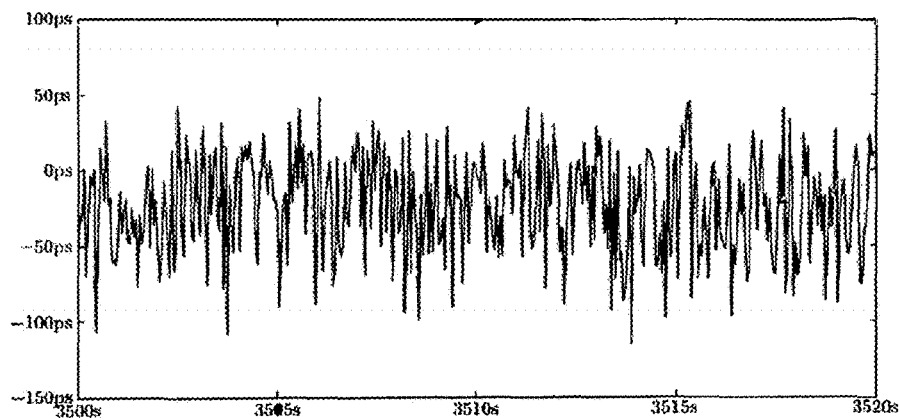
FIG. 4: shows a short-term behavior of the clock skew of the "blue" node vs. the reference node from FIG. 3 over an arbitrarily selected period of 20 s.

FIG. 4 shows a short-term behavior of the clock skew of the "blue" node vs. the reference node from FIG. 3 over an arbitrarily selected period of 20 s. The skew between all pairs of nodes was measured sequentially for at least one hour each, which corresponds to $7.2 \cdot 10^7$ rounds. A maximum clock skew of 180 ps was observed between correctly working nodes.

To test the behavior under worst-case faults, one node was modified with the aim to maximize the skew of the remaining nodes. The analysis indicates that the maximum impact of faults is achieved when faulty nodes send early pulses to nodes that are already ahead and none to those that lag behind. After implementing this behavior, one observes an increase in the maximum skew to 270 ps.

To verify that nodes resynchronize after transient fault conditions, one node was modified to drop out using a manually actuated switch. Triggering the switch every couple of seconds results in randomly distributed restarting times with respect to the clock phase of the correctly synchronized nodes. In 20 measurements, one observes the expected stabilization behavior. In accordance with the earlier discussion, recovery took up to 7 s for our implementation.

The statistical time and frequency stability of the system in long-term measurements were analyzed.

Figure 5:
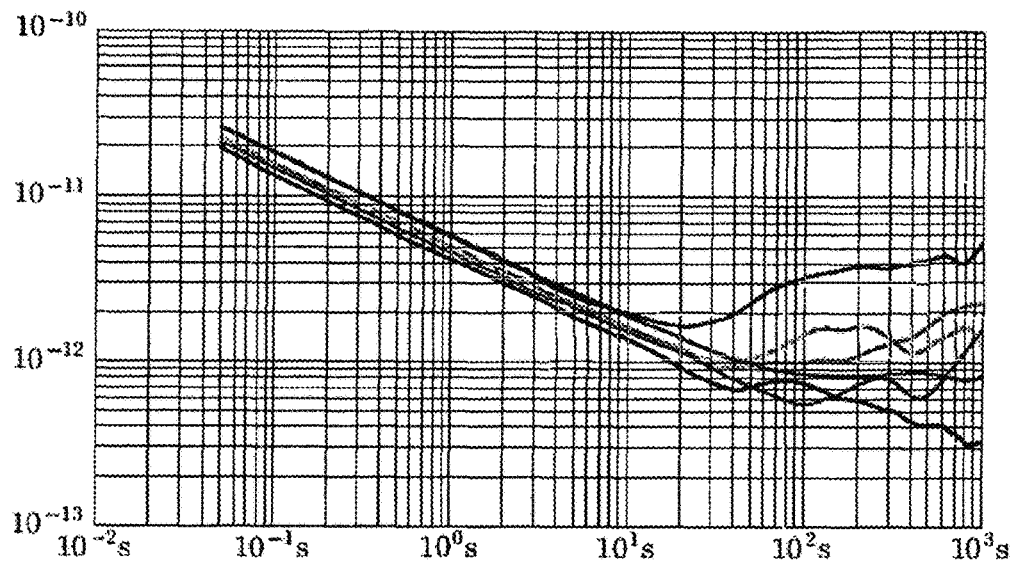
FIG. 5: shows a TDEV between all pairs of nodes, measured sequentially. The colors of pairs match those from FIG. 3.

FIG. 5 shows a TDEV between all pairs of nodes, measured sequentially. The colors of pairs match those from FIG. 3. The TDEV plots are measured between pairs of nodes of the synchronized system. As it can be seen, the noise of the system behaves mostly like white phase noise up to a $\tau$ of approximately 10 s.

The results significantly exceed one's expectations in the range below 10 s. While the algorithm inherently suppresses effects from outliers, as it drops the largest and smallest measurement value in each round, and subsequently averages between the remaining two, this merely suggests improvements of factor 3 to 5 over a free-running oscillator (TDEV of $\sim 1 \cdot 10^{-9}$ s @ 1 s). In contrast, uncertainties of parts in $10^{-12}$ s are already reached above 1 s for the correctly working nodes. These are quite astonishing stability values, especially in light of the crude setup resulting from the employed affordably priced hardware.

As the primary application of the clock synchronization system is to serve as a clock source for circuits, the absolute frequency fluctuations were also analyzed against a Stanford Research FS275 rubidium frequency standard.

Figure 6:
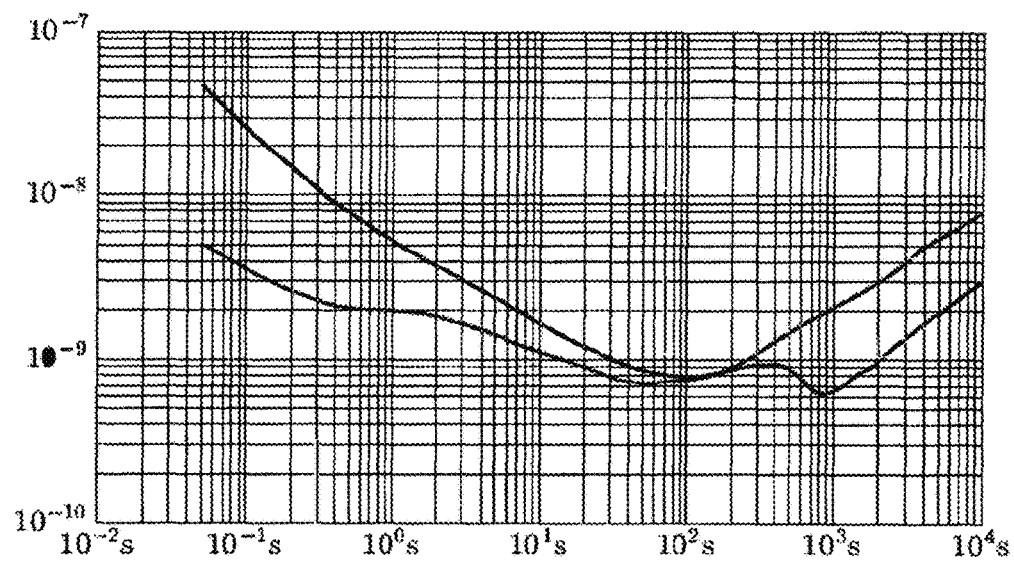
FIG. 6: shows a ADEV between a node and a rubidium frequency standard. The top (blue) curve compares to the free-running oscillator, with the algorithm disabled. The bottom (red) curve is the same node with the algorithm enabled and the system fully synchronized. The temperature effects beyond $\tau$=100 s differ because the traces were recorded on subsequent days with different weather conditions and thus different heating patterns of the building.

FIG. 6 shows an ADEV between a node and a rubidium frequency standard, i.e., the algorithm is deactivated in order to measure the raw performance of the oscillator. The top (blue) curve compares to the free-running oscillator, with the algorithm disabled. The bottom (red) curve is the same node with the algorithm enabled and the system fully synchronized. The long-term stability over $\tau > 10$ s is approximately the same. This is expected, as the long-term behavior is dominated by the temperature-induced frequency fluctuation of the used oscillators. Below a $\tau$ of 1 s, however, the stability of the synchronized system is higher than the one of the free running node, as the noise of the oscillators is averaged by the synchronization of the nodes. Surprisingly, one gains almost an order of magnitude in stability in the short-term range, again significantly exceeding predictions. The temperature effects beyond $\tau = 100$ s differ because the traces were recorded on subsequent days with different weather conditions and thus different heating patterns of the building.

As each node measures the time differences between its own and all other nodes' pulses using Time-to-Digital Converters (TDCs), metastability in the measurements is unavoidable. The traditional approach would hold the TDC outputs in synchronizers, spending time and thus imposing a limit on the operating frequency. According to the invention, it is, however, possible to limit the metastability of each measurement to an "uncertainty between x and x+1 clock ticks".

Figure 7:
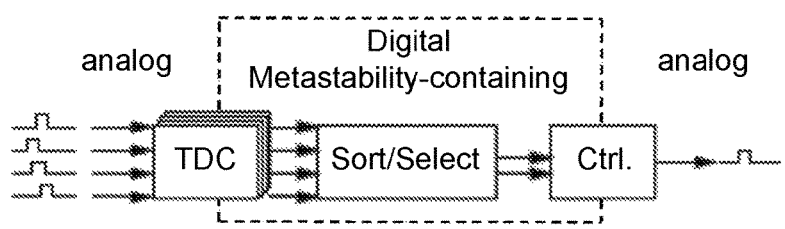
FIG. 7: shows the separation of concerns (analog-digital metastability-containing-analog) for fault-tolerant clock synchronization in hardware.

FIG. 7 illustrates how the fault-tolerant clock synchronization algorithm by Lundelius Welch and Lynch can be implemented with a deterministic correctness guarantee, despite the unavoidable presence of metastable upsets, by a separation of concerns between the analog and the digital part of the circuit: The arrival times of incoming analog clock pulses are measured using TDCs, metastability-containing components ensure that the digital part of the circuit handles the partially metastable outcome of the conversion without loss of precision or the hazard of infecting the entire control logic, and the digital, still partially metastable, signals are converted to analog signals controlling an oscillator.

More specifically, each clock synchronization node does the following.

Step 1: Analog to Digital Delays between remote pulses and the local pulse are measured with TDCs. The measurement can be realized such that at most one of the output bits, accounting for the difference between x and x+1 ticks, becomes metastable.

Figure 8:
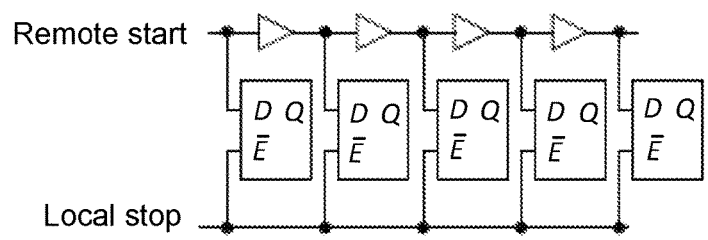
FIG. 8: shows a tapped delay line TDC. It is read as either $1^k 0^{n-k}$ or $1^k M 0^{n-k-1}$, i.e., produces at most one metastable bit and hence has precision-1.

TDCs can be implemented using tapped delay lines or Vernier delay line TDCs, see FIG. 8: A line of delay elements is tapped in between each two consecutive elements, driving the data input port of initially enabled latches initialized to 0. The rising transition of the remote clock signal fed into the delay line input then passes through the line, and sequentially sets the latches to 1; the rising transition of the local clock signal is used to disable all latches at once. After that, the delay line's latches contain the time difference as unary Thermometer Code (TC). Choosing the propagation delays between the latches larger than their setup/hold times, we ensure that at most one bit is metastable, i.e., their status is of the form 1*0 or 1*Mo. The output is hence a precision-1 TC-encoded time difference.

A traditional implementation would use synchronizers on the TDC outputs. This delays the computation and encourages stabilization, but does not enforce it. However, clock synchronization cannot afford to wait. Furthermore, guaranteed correctness is preferred over a probabilistic statement: Four nodes, each sampling at 1 GHz, sample 1:2_1010 incoming clock pulses per second; synchronizers cannot provide sufficiently small error probabilities when allocating 1 ns or less for metastability resolution. Hence, the use of metastability-containing arithmetic instead of synchronizers is mandatory.

Step 2: Encoding the time differences are translated into Binary Reflected Gray Code (BRGC), making storage and subsequent components much more efficient. The results are BRGC-encoded time differences with at most one metastable bit of precision-1.

Step 3: Sorting Network A sorting network selects the (f+1)-th and (n−f)-th largest remote-to-local clock differences (tolerating f faults requires to discard the smallest and largest f values).

This requires 2-sort building blocks that pick the minimum and maximum of two precision-1 BRGC-encoded inputs preserving precision-1.

Step 4: Decoding and Digital to Analog The BRGC-encoded (f+1)-th and (n−f)-th largest remote-to-local clock differences are translated back to TC-encoded numbers. This can be done preserving precision-1, i.e., such that the results are of the form 1*0 or 1*Mo*.

Finally, the two values are used to control the local clock frequency via a Digitally Controlled Oscillator (DCO). However, the DCO design must be chosen with care. Designs that switch between inverter chains of different length to modify the frequency of a ring oscillator cannot be used, as metastable switches may occur exactly when a pulse passes. Instead, a ring oscillator is preferable whose frequency is controlled by analog effects such as changes in inverter load or bias current. While the at most two metastable control bits may dynamically change the load of two inverters, this has a limited effect on the overall frequency change and does not lead to glitches within the ring oscillator.

This gives a guaranteed end-to-end uncertainty of a single bit through all digital computations.

An appropriate encoding is key to designing metastability-containing arithmetic components. If, for example, a control bit u indicating whether to increase x=7 by 1 is metastable, and x is encoded in binary, the result must be a metastable superposition of 00111 and 01000, i.e., anything in Res(oMMMM) and thus an encoding of any number $x' \in [16]$—even after resolving metastability. The original uncertainty between 7 and 8 is massively amplified; a good encoding should contain the uncertainty imposed by u=M.

Formally, a code is an injective function $\gamma:[n] \to B^k$ Bk mapping a natural number $x \in [n]$ to its encoded representation. For $y=\gamma(x)$, we define $\gamma^{-1}(y):=x$, and for sets $X, \gamma(X):=\{\gamma(x)|x \in X\}$ and $\gamma^{-1}(X):=\{x|\gamma(x) \in X\}$. In this work, we consider two encodings for input and output: TC and BRGC. For the 4-bit (unary) TC one uses un: $[5] \in B^4$ with un(1)=0001 and $un^{-1}(0111)=3$; $un^{-1}(0101)$ does not exist. BRGC, compare FIG. 10(a), is represented by rg(x), and is much more efficient, using only $\lceil \log_2 n \rceil$ bits. In fact, rg: $\lfloor 2^k \rfloor \to B^k$ is bijective.

The unary and reflected Gray code encodings un and rg are chosen due to the property that in both encodings, for $x \in [k-1]$, $\gamma(x)$ and $\gamma(x+1)$ differ in a single bit only. This renders them suitable for metastability-containing operations. We revisit the above example with the metastable control bit u indicating whether to increase x=7 by 1. In BRGC, 7 is encoded as 00100 and 8 as 01100, so their metastable superposition resolves to Res(0M100), i.e., only to 7 or 8. Since the original uncertainty was whether or not to increase x=7 by 1, the uncertainty is perfectly contained instead of amplified as above. We formalize the notion of the amount of uncertainty in a partially metastable code word: $x \in B_M^k$ has precision-p (w.r.t. the code $\gamma$) if $$\max\{y-\bar{y}|y,\bar{y} \in \gamma^{-1}(Res(x))\} \leq p,$$

i.e., if the largest possible difference between resolutions of x is bounded by p. The precision of x w.r.t. $\gamma$ is undefined if some $y \in Res(x)$ is no code word, which is not the case in our application.

The arithmetic components presented below make heavy use of BRGC. This makes them more involved, but they are exponentially more efficient than their TC counterparts in terms of memory and avoid the amplification of uncertainties incurred by standard binary encoding.

Figure 9:
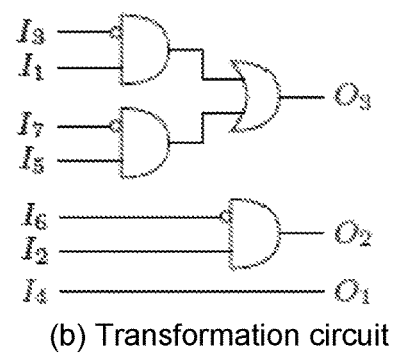
FIG. 9: shows efficient TC-to-BRGC conversion.

FIG. 9 illustrates how precision-1 TC-encoded data can be efficiently translated into precision-1 BRGC-encoded data. FIG. 9(b) depicts the circuit that translates a 7-bit TC into a 3-bit BRGC; note that gate count and depth are optimal for a fan-in of 2. The circuit can be easily generalized to n-bit inputs, having a gate depth of $\lfloor \log_2 n \rfloor$. While such translation circuits are well-known, it is important to check that the given circuit fulfills the required property of preserving precision-1: This holds as each input bit influences exactly one output bit, and, due to the nature of BRGC, this bit makes exactly the difference between rg(x) and rg(x+1) given a TC-encoded input of $1^x M0^{7-x-1}$.

Time-to-digital converters (TCDs) transform the "analog" time difference between a starting and a stopping signal transition into a digital value that can be used for further computations.

According to the invention, two TDC designs are proposed: (i) the first one is built from standard components like binary counters, and (ii) a variant that allows space-optimal storage of measurement values: B stored bits suffice to encode a maximum range of 2B times the delay of a single TDC stage. This is especially interesting if several measurement values have to be stored, while waiting for metastability to resolve.

Figure 10:
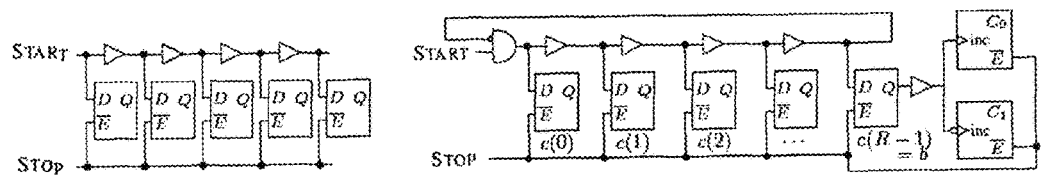
FIG. 10: Left: Tapped delay line TDC architecture. Latches are initialized to 0. Right: Architecture of the proposed metastability-containing TDC. Latches and binary counters are initialized to 0. The register holding b drives the increment inputs of $C_0$ and $C_1$ via a delay buffer. Counter $C_0$ increments on a rising transition, $C_1$ on a falling transition.

FIG. 10 shows on the left a Tapped delay line TDC architecture. Latches are initialized to 0. An architecture of the proposed metastability-containing TDC is shown on the right. Latches and binary counters are initialized to 0. The register holding b drives the increment inputs of $C_0$ and $C_1$ via a delay buffer. Counter $C_0$ increments on a rising transition, $C_1$ on a falling transition.

For the sake of presentation, we assume throughout this section a simultaneous arrival of the stopping signal at all relevant components, following the tapped delay line approach. In practice, one may choose other options, and later on compensate for them or follow the Vernier line approach, choosing different delays for the stopping signal. Throughout the remainder, the abbreviation $[n]=\{0, \ldots, n-1\}$ is used.

Counting Modulo R. In a delay-line TDC, one can read the number cnt of stages that have been passed by the starting signal before the stopping signal arrived by checking for the transition from binary registers with value 1 to those with value 0. Naturally, this assumes that all registers are initialized to 0 and are set to 1 upon arrival of the starting signal. The stopping signal here simply is used to disarm the registers. A natural implementation is with latches whose data input is driven by the delay line elements and whose negative enable is driven by a balanced tree propagating the stopping signal.

Of course, one could achieve the same by initializing the registers to 1, and setting them to 0 at arrival of the starting signal. Note that once the signal passed through the entire delay line (without the stopping signal arriving first), the result is that all registers are correctly "initialized" for the other mode of operation. Hence, if one replaces the registers by 1-bit counters and loop the input signal back from the end of the delay line to its beginning, a "line" with R registers can be used to count the total number of stages passed modulo R. The "line" thus becomes a startable ring oscillator with R stages, each of which in fact is a 1-bit counter.

This abstracts away the issue that, in any real implementation, the counters cannot switch from 0 to 1 or vice versa in zero time. Reading or stopping them at the time the stopping signal arrives may therefore result in metastability. This is unavoidable, regardless of implementation.

However, for this particular application, the invention proposes a solution. It bears no advantage to decrease the delay per stage to the point where more than one counter (or the value read from it) may become metastable due to the stopping signal, as the accuracy of the resulting TDC does not increase—only its size becomes larger, as more stages are required for covering the same time window by R stages. Consequently, one can safely demand that the time windows during which the counters are vulnerable to metastability are non-overlapping. In this case, all that is required is to wait until the at most one metastable counter (or register) stabilizes.

Outside the time interval (window of vulnerability) during which the arrival of the stopping signal (respectively, the counter being copied) potentially causes the counter (respectively, the copy) to become metastable, the counter (respectively, a register that it drives) has a stable output value.

In this case, it does not matter whether the counter's value stabilizes to 0 or 1 afterwards, as one can simply interpret this as the counter not having counted up yet or completed the operation, depending on the resulting value.

Even if metastability occurs, it implies no loss of accuracy. The limit of the quantization error that can be achieved is given by the setup/hold times required by the elements used to store the counter values.

Counting the Number of Ring Oscillator Cycles. Given that cnt mod R can be determined, all that needs to be done for keeping track of cnt is to count the number cyc of full cycles the ring oscillator completes between the starting and stopping signals.

Instead, one needs to implement the counter such that when it recovers from metastability induced by an incomplete upcount, this means that it "decides retroactively" whether the up-count took place or not consistently. This can be done in different ways.

In a first embodiment of the TDC according to the invention, two redundant binary counters $C_0$ and $C_1$ may be used, which share the same least significant bit b; for the purpose of notation, $C_0$ and $C_1$ denote the counters without the least significant bit. Here, b also serves as a control bit deciding on the counter $C_b$ that is to be read for determining the measurement value. Note that b is simply given by the value of the 1-bit counter attached to the last stage of the ring oscillator, i.e., b=c(R−1). When the stopping signal arrives, either all counters (1-bit and binary) are halted or their values are copied and stored. The resulting circuit is depicted in FIG. 2.

The circuit's underlying idea is to use the value stored in $C_0$ if b=0 and the value in $C_1$ if b=1, making sure that $C_b$ is not metastable if c(R−1)=b holds. Thus the value of $C_{1-b}$ is irrelevant as long as the last 1-bit counter has value b, and it has time to increment and stabilize while being irrelevant.

In order to ensure that $C_b$ does not become metastable, taking into account that b itself may become metastable, the notion of the windows of vulnerability of a 1-bit counter may be generalized to the binary counters $C_0$ and $C_1$ in a straightforward manner. One then proceeds as follows:

Initialize b:=0, $C_0$:=0, and $C_1$:=0.

The windows of vulnerability of the counter holding b and $C_0$ (respectively $C_1$) are disjoint: this may be achieved by incrementing (modulo 2) the last 1-bit counter to b at the end of a complete oscillator cycle, and thereafter incrementing counter $C_{1-b}$ delayed by $T_{buf}$ i.e., the delay of the buffer between the output of the last 1-bit counter and the binary counters' increment inputs; cf. FIG. 10. Denote by $T_d$ the propagation delay of a delay element within the ring. With the delay constraint that a binary counter completes an increment within (R−1) $T_d-T_{buf}$ time, one has that $C_{1-b}$ has stabilized as soon as the last 1-bit counter is incremented (modulo 2) to 1−b.

When reading the counter, cyc is computed as $2C_b+b$. Since $2C_b+b$ is equal to the value of the composed binary counter ($C_b$; b), one may view bit b as a shared bit of the composed binary counters ($C_0$; 0) and ($C_1$; 1) that hold the value cyc in case of b=0 and b=1, respectively. This allows for an efficient method for the TDC to directly return the binary encoding of cyc.

The complete TDC is given by combining the methods of counting modulo R and determining cyc as described above. Thus, the constraints the implementation needs to satisfy are the following.

The delay elements' latencies $T_d$ are large enough to ensure that the windows of vulnerability to metastability of all 1-bit counters are mutually disjoint.

The buffer between b and the two counters $C_0$ and $C_1$ has delay $T_{buf}$, which is larger than the discrepancy in time of a not-perfectly simultaneous arrival of the stopping signal at b and $C_0$, respectively, b and $C_1$.

The counters $C_0$ and $C_1$ are sufficiently fast to perform an up-count between two consecutive increments of the same 1-bit counter, i.e., within time (R−1)$T_d-T_{buf}$.

A crucial point in the proposed solution is that the TDC allows to compare the starting signal to multiple "stopping" signals, by taking a "snapshot" of the counters for each arriving signal. As a downside, the described version of the TDC incurs an overhead in terms of the number of bits stored for a measurement: If the binary counters have B bits, one stores 2B+R bits, but the maximum cnt value is $2^B R-1$, theoretically requiring only B+⌈log R⌉ bits.

In the previous section, the TDC was introduced and shown that it can be read reliably, without even having to actually stop it: it is sufficient to copy all 1-bit and binary counters at arrival of the stopping signal without halting the ring. While using only standard components like binary counters, it stores values with more bits than required by theoretical lower bounds.

Figure 11:
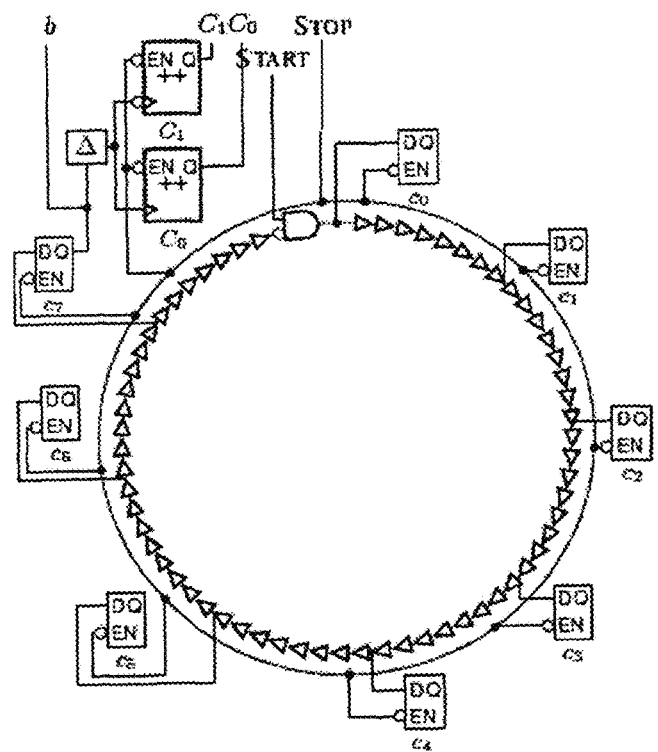
FIG. 11: is a schematic overview of an FPGA prototype of the tapped delay line TDC according to an embodiment of the invention.

FIG. 11 is a schematic overview of an FPGA prototype of the tapped delay line TDC according to an embodiment of the invention, realized based on a Xilinx Virtex-4 chip.

The prototype uses a ring of length 8 and its 1-bit counters c(0), . . . c(7) are realized by simple D-latches, available as hardware primitives on the target platform. The required delay elements between their data inputs are built using lookup tables (LUTs): 8 LUTs had to be chosen per stage (postlayout timing-analysis gave a total delay of 4-5 ns) to ensure a propagation delay large enough to be measurable with our logic analyzer (minimum sample period is 4 ns). Binary Counters $C_0$ and $C_1$ consist of 7 D-flip flops each. Latch and counter outputs are routed to FPGA output pins. The logic analyzer was then used to record the circuit operation. As already stated, the delay between the b-bit (latch c(7)) and the binary counters is essential for safe operation: additional LUTs ensure the required minimum delay, while a place and route constraint controls its maximum delay.

Both START and STOP are derived from two independent clock sources and are afterwards divided by counters. Bounding the skew on STOP is critical: it must be smaller than the delay between the b-bit and the binary counters to ensure correct operation. Furthermore, all 1-bit counters must be stopped in close temporal proximity to achieve a good precision. Therefore, one controls the skew on this signal using a maximum skew constraint. A skew of 790 ps was achieved in the worst case.

The prototype TDC operates in single shot mode: after each measurement, the TDC is reset (res_n signal). The timing of the reset operation is based on the START signal. The logic analyzer is triggered to the rising edge of START, indicating the end of a reset cycle and the begin of a new measurement.

Figure 12:
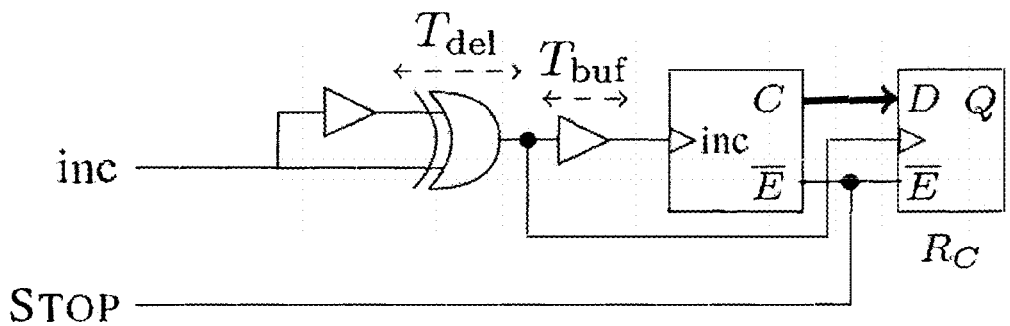
FIG. 12: shows an implementation with look-ahead Gray code counter and register. The counter C is initialized with 1. Register $R_c$ is of same width as the counter, and initialized with 0.

FIG. 12 shows an implementation with look-ahead Gray code counter and register according to an alternative embodiment. The counter C is initialized with 1. Register $R_c$ is of same width as the counter, and initialized with 0.

According to the alternative embodiment, a counter operating in Gray code may be used, that is further required to tolerate potential metastability at its increment port in the following sense: If the increment bit is metastable, the counter must guarantee that (i) only a single bit can become metastable, and (ii) given the (unchanged) values of the other bits, that the metastable bit is the currently least significant bit.

This circuit can be used to read the TDC in a way requiring to store optimal B+⌈log R⌉ bits only. The transistor count of this encoding circuit is of the same order as that of the TDC itself, assuming that R>>B. It is first shown how to efficiently encode and store the 1-bit counter states holding cnt mod R. Then it is shown how to get rid of having to store both binary counter values $C_0$ and $C_1$.

Encoding Cnt Mod R. As a starting point, one knows that no circuit can (deterministically) avoid metastability of an output bit if, given all other inputs, the output value depends on an input bit that may be metastable. Therefore, the first key insight is that one must use an encoding guaranteeing that metastability of one of the 1-bit counters (i.e., uncertainty about whether an additional stage has been triggered by the arrival of the stopping signal or not) must not cause metastability of more than one output bit: otherwise, for any encoding without redundance, we must lose accuracy of the measurement, as two or more bits resolving to arbitrary values must induce a change of the encoded value larger than 1. In other words, we must use a Gray code, for which any up-count changes exactly one bit.

For two different output bits 0 and 0', one has that B(0)∩B(0')=∅ by definition of a Gray code: for each increment, only a single output bit changes. Therefore, a single metastable input bit may cause metastability in the output bit "responsible" for the corresponding up-count only.

As an additional advantage of this approach, the same Gray code and circuit can be used to encode the number of 0s in R-bit strings 0*1*: Switching between the unary encodings $1^m 0^n$ and $0^m 1^n$ is equivalent to taking the complement of the input. Propagating the inverters from all inputs through the XOR tree to the outputs yields that it suffices to negate a fixed subset of the output bits to obtain the Gray code for the complemented unary input encoding.

As before, one needs to ensure that any snapshot (induced by the arrival of the stopping signal or latching) of the output bits of the unary to Gray code circuit has the property that (i) at most one of the bits is currently making a transition, and (ii) that it is the currently least significant bit. That is, the windows of vulnerability of the (latches storing the) output bits are non-overlapping. If so, one can read cnt mod R from the TDC simply by reading the output bits of the above circuit.

It is essential to take into account that the encoding circuit introduces additional delays that affect the measurement. This is reflected in the fact that one now stores the number of passed inverter stages since the starting signal that has been registered by the output bits of the encoding circuit at the time when the stopping signal arrives. Thus, it is crucial to ensure a known and uniform delay of the encoding circuit, which then is compensated by an equal (logical or physical) delay applied to the starting signal.

To this end, one can make use of an equal-frequency Gray code, which ensures that (i) all output bits flip at the same (amortized) frequency, and (ii) the minimal number of increments between two consecutive flips of an output bit is larger.

These properties come with several advantages:
- The depths of the XOR trees for all output bits are the same, as they depend on the same number of input bits.
- The load and power consumption is symmetrically distributed across the encoding circuit.
- The minimum time between two consecutive signal transitions of a XOR gate is larger than for other codes. Since the unary to Gray code circuit needs to change outputs every time a 1-counter is incremented (modulo 2), this is useful in presence of small delay element latencies $T_d$ required for a low quantization error of the TDC.

Encoding Cyc and Using the Control Bit b Safely. The value b of the 1-bit counter attached to the last stage of the ring oscillator decides on both the interpretation of the Gray code value computed by the encoding circuit and the counter $C_b$ whose value is to be read. While the convenient structure of the Gray code would allow to circumvent this problem by deferring evaluation of b until after it stabilized (without wasting memory), we would still have to store the values of both binary counters.

This is not necessary either. One may replace the two counters by a single Gray code counter with look-ahead: consider the circuit in FIG. 10. Both $C_0$ and $C_1$ and the delay buffer may be replaced with a Gray counter that is incremented by the last 1-counter. When the counter is triggered, it is required (i) that it finishes an up-count within a single oscillator cycle, and (ii) that its outputs are stable (although it is internally incrementing) except within a short time window after an increment is triggered (thus the term look-ahead). Note that such a counter can be implemented by a Gray counter that fulfills only (i) and whose outputs are latched upon an increment.

For the purpose of reading cnt mod R, one may ignore the value of the last 1-bit counter (that originally held b), which is equivalent to deferring the evaluation of the last bit for this purpose. Thus, in case the counter becomes metastable, one effectively waits until metastability has ceased (which happens while the value lies in storage). Then, one determines whether cyc is odd or even from the stabilized counter value, i.e., one learns b. From b, one can infer how to correctly interpret the value stored for cnt mod R, permitting to compute cnt.

The number of bits that need to be stored for a measurement are thus $B+\lceil \log R \rceil$, which is optimal if one chooses R to be a power of 2. The number of gates in the TDC, the encoding circuit for cnt mod R, and the final decoding circuit is asymptotically dominated by R, assuming that $R \geq B^2$ and circuits of size $O((B+\log R)^2)$ are used for the counter replacing the two binary counters and the decoding logic.

The proposed TDCs can be operated in modes different from a single-shot startstop transition.

Time Difference of Two Remote Signals. In this mode of operation, the local clock source defines the time window $[t_{min}; t_{max}]$ during which the two compared signal transitions must arrive; the TDC counter(s) must be large enough such that they will not overflow within this time span. The TDC is armed at time $t_{min}$. One my use the OR of the two remote signals as starting signal and their AND as stopping signal. At $t_{max}$, one may read the registers holding the result, since we assumed that both signals arrive during $[t_{min}; t_{max}]$.

Denote by $t_1; t_2 \in [t_{min}; t_{max}]$ the times when the two signal transitions arrive. Observe that the above procedure measures $|t_1-t_2|$. Thus, it remains to determine which signal arrives first. To this end, we use the flank of, e.g., the second signal to sample the current state of the first into a register. This leads to metastability if (and only if) $t_2 \approx t_1$. The register thus stores the sign of $t_1-t_2$ if it is stable 0 or 1, and if it is metastable, then both flanks arrived almost concurrently. As usual, one makes sure that metastability of the sign register excludes the possibility that other TDC registers are metastable; thus, the sign does not matter in case it is metastable (we obtain either plus or minus one.)

This approach has the advantage of being highly accurate: It avoids incurring the discretization error twice, and the deviation of the oscillator from its nominal frequency induces an error proportional only to $|t_1-t_2|$.

Dedicated Starting Signal with Multisampling. The proposed TDCs also allow for multisampling. For this variant, one may assume that it is known that one signal flank is guaranteed to arrive first, at time $t_0 \in [t_{min}, t_{max}]$, while k other flanks arrive at times $t_0 \leq t_1, \ldots, t_k \in [t_{min}, t_{max}]$. We arm the TDC at time $t_{min}$ and may read the results at time $t_{max}$, as before. However, we use the dedicated starting signal to start the oscillator at time $t_0$ and have k separate sets of registers holding TDC measurements attached to the counters, one for each of the k other signals.

For each $i \in \{1, \ldots, k\}$, we now simply use the flank of signal i to store a reading in the $i^{th}$ set of registers.

The result of these measurements can be used to compute the time difference between any two of the signal transitions (including the starting signal arriving at time $t_0$), where again the error induced by the oscillator's deviation from the nominal frequency is proportional to the actual time difference of the signals. However, note that the discretization error of the TDC enters the picture twice, unless one of the two compared signals is the starting signal.

Local Start without Stopping the Oscillator. In some cases, the starting signal can be synchronized with the TDC ring oscillator itself. This happens if the TDC oscillator is never stopped, because it is used as system clock for the local logic, or if it is slaved to the (local) system clock in order to increase its precision (i.e., decrease its deviation from the nominal frequency, e.g., by temperature compensation).

In this setting, one can arm the proposed TDCs "on the fly" by performing the reset of the storage registers in a way that is synchronized to the oscillator. After engaging the reset signal of all registers including the counters, we wait until the next time, say t, when the oscillator starts a new even cycle. We then deactivate the reset signals of the registers (including the multi-bit counters') in the order given by the oscillator stages, with sufficient delay so that the respective oscillator stages (i.e., the 1-bit counters) are already in the state (interpreted as) 0 when this happens. Note that this is a fairly loose timing requirement, as we have an entire oscillator cycle until the registers must be ready to store a new value again.

The TDC is then considered to have received the starting signal at the time to when it begins its next cycle. This cycle is odd, and thus all counters are in a state consistent with to being the starting signal's arrival time.

Figure 13:
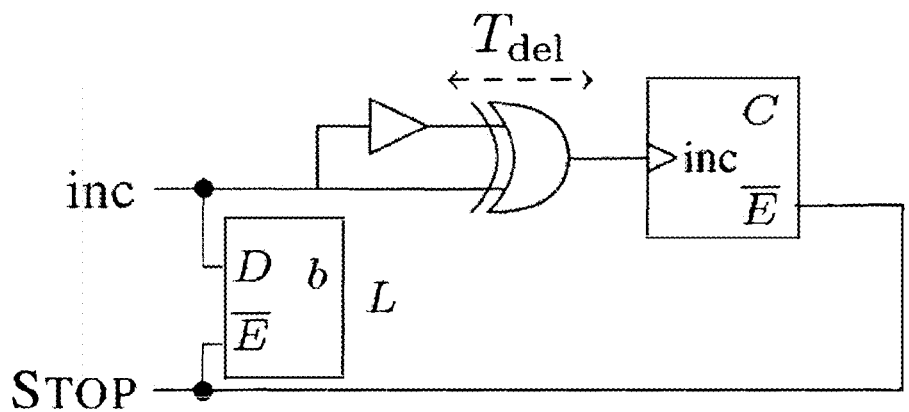
FIG. 13: shows a Gray code counter variant with single-bit latch.

FIG. 13 shows a Gray code counter variant with single-bit latch. The Gray code counter variant of the previous embodiment requires that the output of the counter is stable at all times outside a time window of size similar to the critical window of the latches (limited by $T_d$, cf. FIG. 7). For high accuracy TDCs with small $T_d$, this (a) either imposes a harsh constraint on the design of the counter, which is potentially difficult to meet, or (b) requires an implementation with additional registers as a workaround (see FIG. 8).

Figure 14:
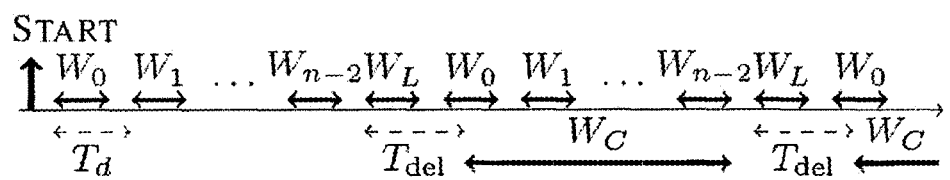
FIG. 14: shows critical windows for the Gray code counter variant of FIG. 13.

For these cases, the invention proposes a different metastability-aware design depicted in FIG. 13: one adds one extra (single-bit) latch L with output b only. The XOR gate delays the counter increment input and additionally transforms rising and falling transitions to pulses, allowing the use of standard single-edge triggered flip-flops for the Gray code counter implementation. Analogously to the redundant binary counter solution, only non-overlapping critical windows of latch L and Gray code counter C are required, as shown in FIG. 14.

Given a (stabilized) TDC readout, again one determines whether cyc is odd or even —this time not from the counter value, but from the explicitly stored b in latch L. This enables to correctly interpret the value stored for cnt mod n as before. Moreover, it is used to account for an incomplete up-count of the Gray code counter: if the parity of the stored counter value differs from b, the counter should have been incremented, but has been prevented from doing so by the stopping signal. In this case, one performs an up-count on the stored value (w.r.t. the used Gray code). This results in a correct value, because metastability of the counter affects only the (unique) bit that is being changed on the respective up-count.

Naturally, it may also happen that b becomes metastable. However, in this case, the delay $T_{del}$ ensures that the counter did not start the increment corresponding to the (incomplete) transition of L. Thus, either resolution of b results in a correct interpretation of the measurement: If L stabilizes as if it had not been triggered, all is well; if it stabilizes as if it had been triggered, one fixes the counter value accordingly.

Referring to FIG. 7, the outputs of the above-described metastability-containing TDCs can be input into a sorting network, that computes the maximum or minimum of two valid strings. What is required is that the input has precision 1, in the sense that a valid string with a metastable bit may stabilize to a binary string representing some value x or x+1.

The same holds for the output. Thus, the sorting network is required to fully contain metastability, i.e., things "must not become worse."

According to a first embodiment of a sorting network, this may be achieved by the following steps: (1) Determine the unary encodings of each input, (2) take the bitwise OR or AND, respectively, and (3) determine the Gray code of the results. The third step is straightforward, exploiting that each bit of the unary encoding affects only a single bit of the Gray code. Hence, one does not need to worry about containing metastability and may use XOR trees (one for each output bit), resulting in fewer than N additional gates for $\max_{rg}$ and $\min_{rg}$ each; the depth is smaller than log N.

Hence, it remains to design a circuit that determines the unary encoding of a given valid B-bit Gray code string in a metastable-containing fashion.

Figure 15:
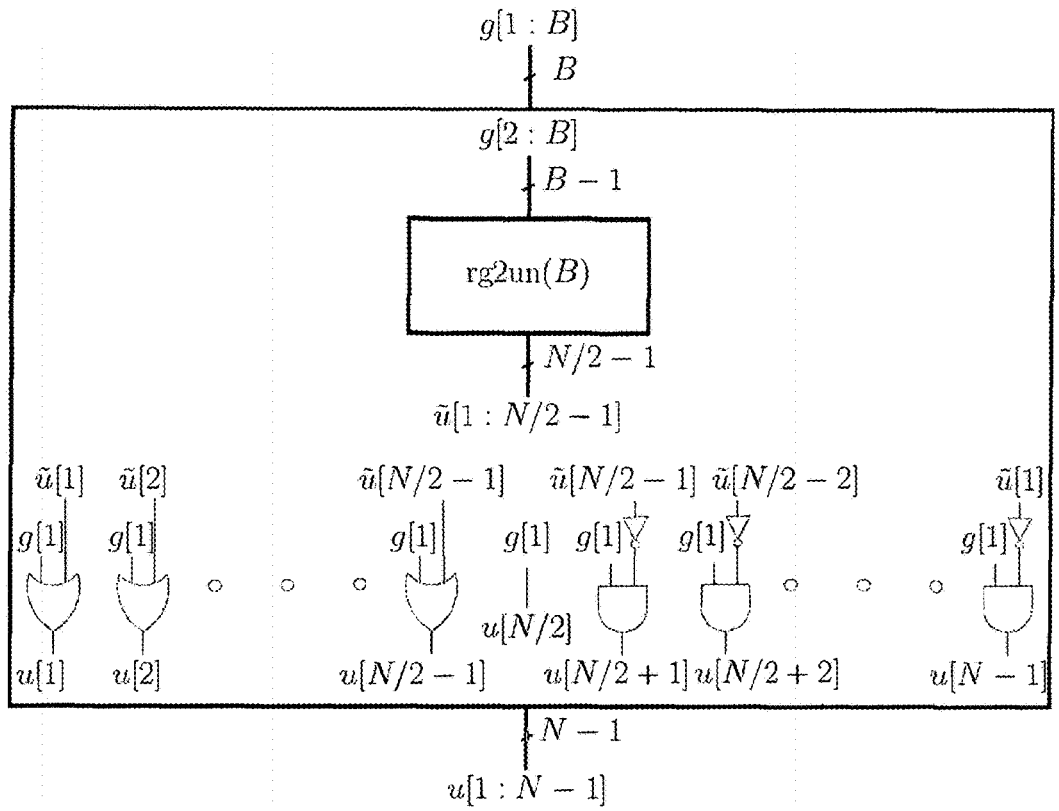
FIG. 15: shows a recursive implementation of a method for determining a unary encoding of a given valid B-bit Gray Code string according to an embodiment of the invention.

FIG. 15 shows a recursive implementation of a method for determining a unary encoding of a given valid B-bit Gray Code string according to an embodiment of the invention. To avoid "amplifying" metastability by "infecting" bits of the output that can be correctly computed, it cannot readily branch on the first bit of the code: if the control logic becomes metastable, the branches may produce metastable outputs without need, which ultimately would corrupt the output irreversibly.

This problem may be avoided by considering all possible stable values of the first bits of the two inputs g and h (00, 01, 01, and 00), determining the respective outcomes, and then selecting from these results in a safe way. Roughly speaking, if, say, h[1]=M, then h[2:G]=$rg_{B-1}$(N/2−1), and this can be exploited to show that the recursive call computes the same results both for the h[1]=0 and the h[1]=1 branch. Hence, "all" one needs to do is to feed the results into a multiplexer that uses g[1] and h[1] as control bits and has the property that if the inputs between a metastable control bit selects are identical, the output is stable nonetheless.

Standard multiplexer circuits do not have this property, so the first step is to devise such a metastability-containing multiplexer (CMUX).

Figure 16:
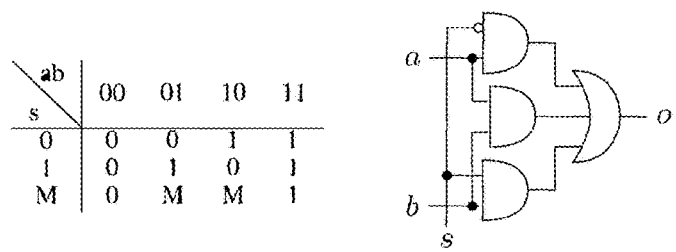
FIG. 16: Left: Logic table of a metastability-containing (2:1)-CMUX, whose single control bit s is used to select between two inputs a and b. Right: Implementation of a (2:1)-CMUX using AND gates and an OR(3) gate from [5].

FIG. 16 shows a logic table and an implementing circuit for a (2:1)-CMUX (i.e., selecting between two inputs using one control bit) according to an embodiment of the invention. The vital difference to a standard multiplexer is that it outputs a*b in case the control bit s is metastable; a standard multiplexer may yield metastable output if s is metastable, even if a and b agree, i.e., the selection does not actually matter. A CMUX that selects among inputs of length B each is denoted by CMUX(B) (as it is simply B copies of a CMUX).

Figure 17:
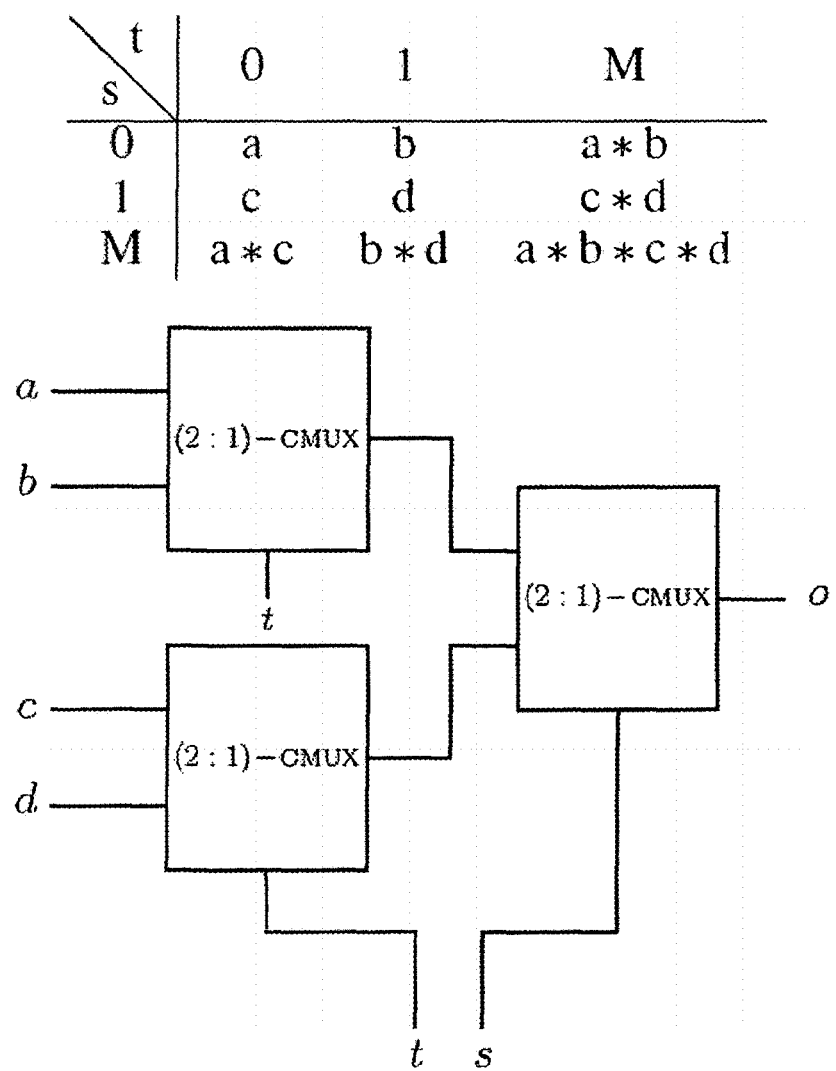
FIG. 17: Top: output of a (4:1)-CMUX. The control bits are s and t, the selectable inputs are a, b, c, d. Bottom: Implementation using (2:1)-CMUX according to an embodiment of the invention.

FIG. 17 shows how the principle described in connection with FIG. 16 may be generalized to 2 control bits, i.e., selection between 4 inputs.

2-Sort(B) Implementation

Using the first bits of the two Gray code inputs g and h as control bits, one can feed suitable inputs to the CMUX to determine the correct output recursively.

Figure 18:
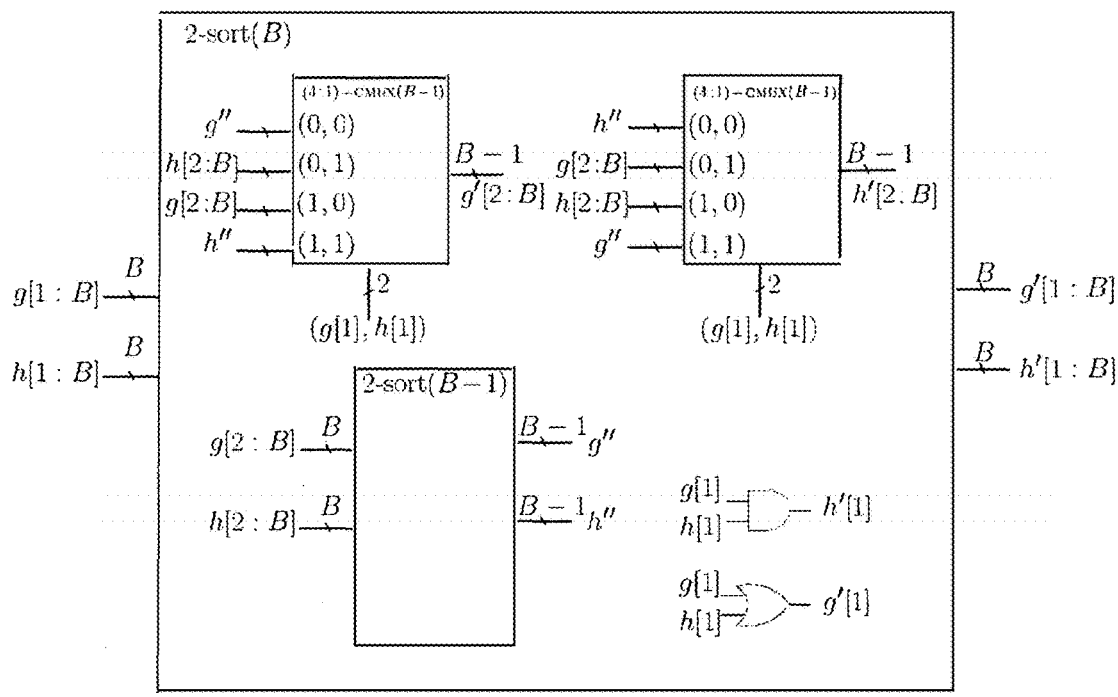
FIG. 18: shows a recursive implementation of 2-sort(B) according to an embodiment of the invention.

FIG. 18 shows a recursive implementation of 2-sort(B) according to an embodiment of the invention. g[1] and h[1] are the leading bits of g and h respectively. g[2:B] and h[2:B] are the remaining strings after removing the first bit.

Table III shows a summary of cost and delay of the implementation of 2-sort(B), neglecting the issue of large fanout for the exponentially sized solution. The effect of reducing the fanout is small for the polynomially sized solution: each bit has fanout O(B), and no large fanouts appear on the critical paths determining the delay. Hence, the comparison is in favor of the exponentially sized circuit w.r.t. gate and transistor counts, while it slightly favors the polynomially sized solution w.r.t. delay. This makes the results simple to interpret: the exponentially sized solution has a factor 2 to 3 smaller delay, but the polynomially sized solution has dramatically smaller transistor counts even for moderate B=8.

Considering now the application of these two implementations in the context of sorting networks, one may suppose the sorting network has n channels, i.e., n strings are sorted. The inputs are valid Gray code strings of length B. The output of the sorting network are the n input strings, sorted according to the order induced by $g\langle h\langle\langle\ \rangle g\rangle_{rg} \Leftrightarrow h\langle_{rg}$.

In the context of the invention, one is specifically interested in sorting networks with n=3f+1 channels for some f∈N, as this is the minimum number of nodes required to tolerate f faulty nodes in the clock synchronization by Lynch and Welch.

Table IV shows gate and transistor counts for metastability-containing sorting networks with n∈{4,7,10} B-bit inputs, for which the optimal implementation uses 5; 16 and 29 modules of 2-sort(B) circuits, respectively.

Although the implementation according to the first embodiment (brute force) is more costly in terms of transistors, the translation from Gray code to unary encoding and vice versa needs to be done only once for each input. This reduces the transistor count for the brute-force solution notably, taken into account in Table IV. Thus, in particular for larger values of n, the polynomial size solution is outperformed for small values of B of roughly up to 4. For B≥8, the asymptotics clearly kick in and result in a dramatic gap for all considered values of n.

According to a further embodiment of the invention, one may first determine which of the strings to select in a metastability-containing manner, represented by two control bits. It may happen that one or both of these bits become metastable, but in this case the structure of the Gray code implies that the input strings were almost the same, distinguished only by which of their bits are metastable. Combining the selected strings using a CMUX, one ensures that the stable bits shared by both strings do not become metastable in the output, despite possible metastability of the control bits.

Figure 19:
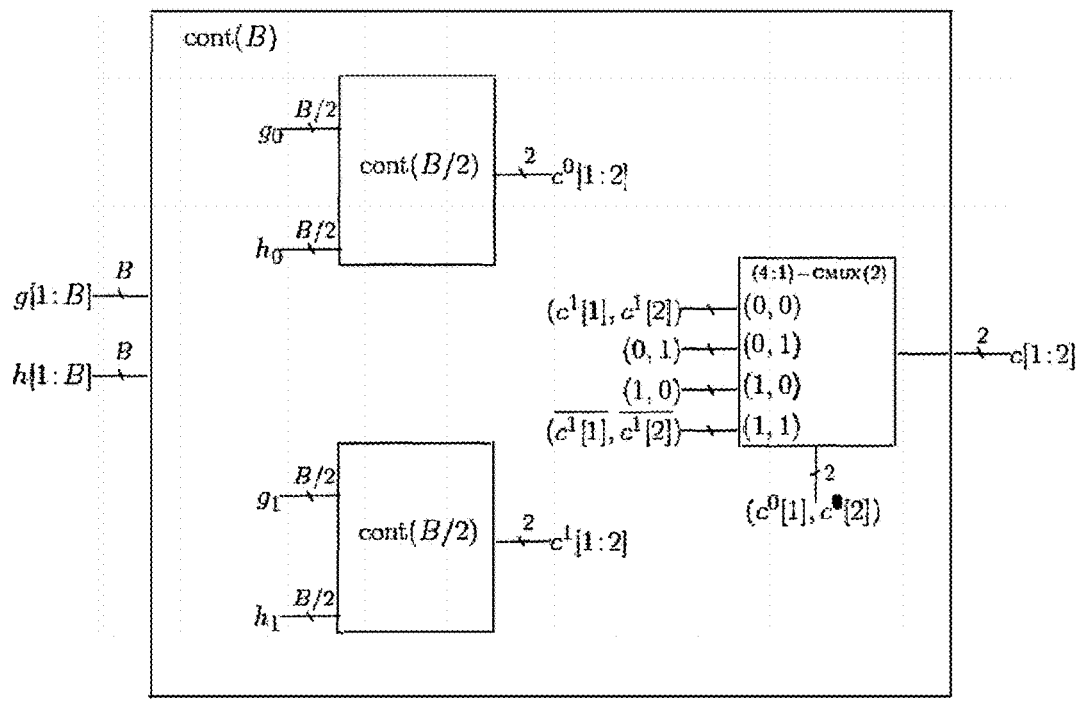
FIG. 19: shows a recursive implementation of cont(B) according to a further embodiment of the invention.

FIG. 19 shows a recursive implementation of cont(B) according to a further embodiment of the invention.

The subcircuit computing the control bit performs a 4-valued comparison: given stable inputs g, h, it returns 01 or 10 if $\langle g\langle\langle\ \langle h\rangle\rangle$ or $\langle g\rangle\rangle h\rangle$, respectively. If g=h, it returns 00 or 11, depending on the parity of the equal strings. For inputs with metastable strings, the behavior is most conveniently specified by considering all possible resolutions of the inputs, determining the respective outputs, and obtaining the output for the original inputs as the "superposition" of all options under the * operator. For example, c(0111, 0101)=01,
c(1001, 1001)=00,
c(1M10, 1111)=10*10=10,
c(010M, 0100)=11*01=M1,
c(111M, 111M)=11*10*01*00=MM.

a) Specification:

For B∈N, a (combinational) cont(B) circuit is defined as follows.

Input: g, h∈$S_{rg}^B$,
Output: c∈$\{0,1,M\}^2$,
Functionality: c:=$\prod_{(g',h')\in res(g)\times res(h)}^*\hat{c}(g',h')$,
where for g',h'∈$\{0,1\}^B$,ĉ(g',h') is defined as follows.

| ĉ(g', h')[1] | ĉ(g', h')[2] | Semantics |
|---|---|---|
| 0 | 0 | g' = h' and par(g') = 0 |
| 0 | 1 | (g') < (h') |
| 1 | 0 | (g') > (h') |
| 1 | 1 | g' = h' and par(g') = 1 | b) Implementation:

The base case is trivial.

For B=1, the specification given in the above definition is met by the identity circuit returning output (g, h) for inputs g, h∈{0,M,1}.

For B that is a power of 2, the specification is implemented recursively. The idea is to recursively use a B/2-bit circuit on inputs $g_0$, $h_0$ and $g_1$, $h_1$, respectively, and use the result of the second call to resolve a tie from the first call. Keeping track of the parity in case of a tie is essential to use the result of the second call correctly: if the parity of $g_0=h_0$ is odd, one needs to negate the control bits returned by the second call.

Figure 20:
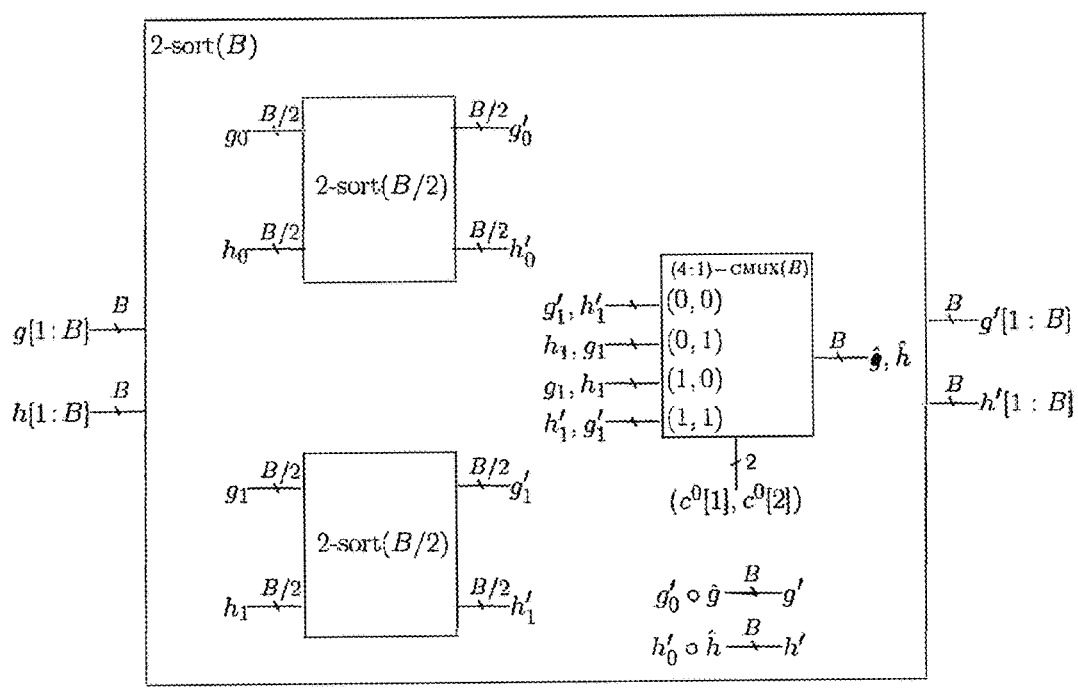
FIG. 20: shows a recursive implementation of 2-sort(B). To obtain the control inputs ($c^0[1]$; $c^0[2]$), $g_0$ and $h_0$ are fed into a cont(B/2) circuit, cf.

FIG. 20 shows a recursive implementation of 2-sort(B). To obtain the control inputs ($c^0[1]$; $c^0[2]$), $g_0$ and $h_0$ are fed into a cont(B/2) circuit, cf. FIG. 19.

Again, the base case is trivial.

For B=1, the specification is met by the circuit returning AND(g, h) and OR(g, h) for inputs g,h∈{0,M,1}.

The sorting circuit is implemented as follows. One determines $(\max_{rg}\{g,h\})_0 = \max_{rg}\{g_0,h_0\}$ by a recursive call (the same for $\min_{rg}$). A second recursive call determines $\max_{rg}\{g_1,h_1\}$ and $\min_{rg}\{g_1,h_1\}$. Finally, one uses a call to cont (B/2) to compute the control bits selecting which of the strings $g_1$, $h_1$, $\max_{rg}\{g_1,h_1\}$, and $\min_{rg}\{g_1,h_1\}$ to select as $\max_{rg}\{g,h\}_1$.

The recursive construction requires computing control bits in each level of the recursion. However, the circuit computing the control bits recurses on the same substrings as the sorting circuit, and has slightly smaller delay. This enables convenient reuse of the outputs of the recursive calls of the control circuit as control bits for the recursive calls of the sorting circuit. Exploiting this insight, one arrives at a highly efficient 2-sort implementation.

Given a metastability-containing 2-sort implementation, it is now straightforward to sort multiple inputs using standard techniques. Taking any sorting network, one can plug in the metastability-containing 2-sort circuit according to the invention to obtain a metastability-containing sorting network. Cost, delay, and, in first-order approximation, area and power of the sorting network scale linearly with the cost and delay of the 2-sort implementation.

Suppose the sorting network has n channels, i.e., n strings are. The inputs are valid Gray code strings of length B. The output of the sorting network are the n input strings, sorted according to the order induced by g⟨h⇔⟨ ⟩⟪h⟩.

Figure 21:
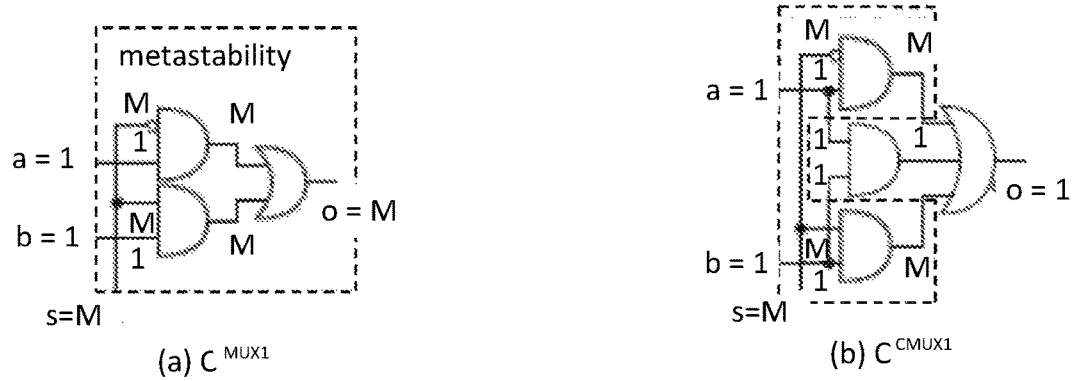
FIG. 21: shows gate-level MUX behavior under inputs a=b=1; in this case the output should be 1 regardless of the select bits s. For s=M, however, the standard MUX (a) can become metastable. The CMUX implementation (b) according to an embodiment of the invention uses logical masking and outputs 1.

FIG. 21 shows gate-level MUX behavior under inputs a=b=1; in this case the output should be 1 regardless of the select bits s. For s=M, however, the standard MUX (a) can become metastable. The CMUX implementation (b) according to an embodiment of the invention uses logical masking and outputs 1.

More specifically, the CMUX shown in FIG. 21(b) behaves as follows:
(1) If s=0 the output is a,
(2) if s=1 the output is b,
(3) if s=M but a=b the output is a, and
(4) the output is unspecified if s=M and a≠b.

Condition (3) reflects that even if the choice between a and b is unclear due to a metastable select bit, this must not affect the output in the case of a=b.

Omitting Condition (3) yields a standard MUX which is oblivious to a metastable or otherwise degraded select bit.

Hence, the gate-level CMUX implementation in FIG. 21(b) mitigates the effect of the metastable select bit using logical masking in the form of a third AND-gate.

Figure 22:
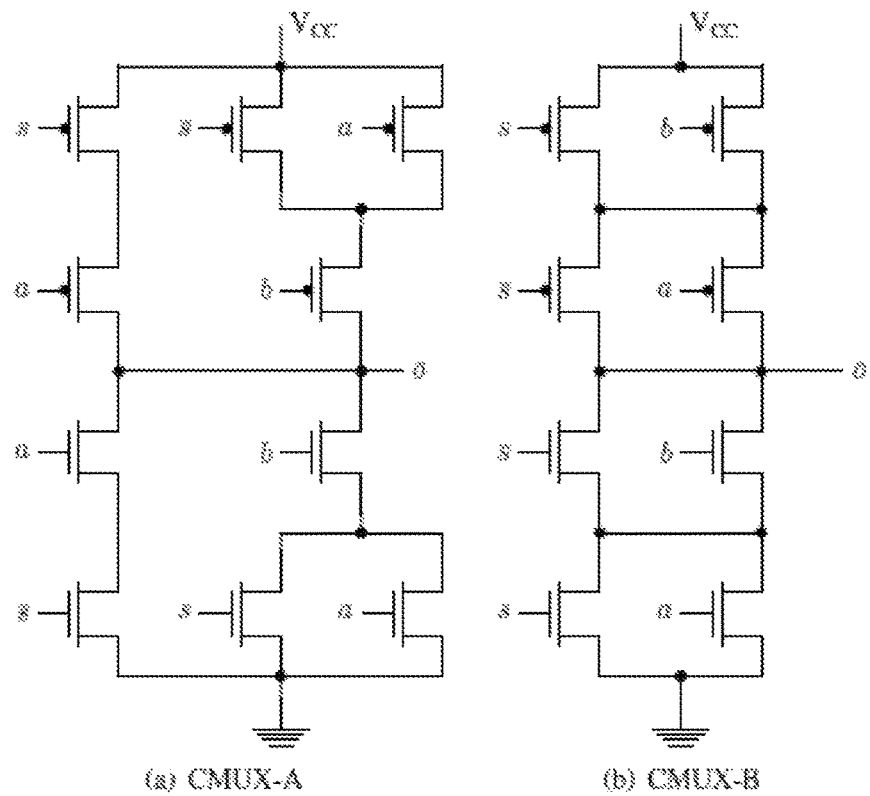
FIG. 22: shows CMUX implementations according to embodiments of the invention. CMUX-A (a) is a conservative implementation that requires 10 transistors and has a low peak current, CMUX-B (b) saves 2 transistors but has a slightly increased peak current in the case of s =M and a=b.

FIG. 22 shows transistor-level CMUX implementations according to embodiments of the invention. The invention proposes two transistor-level implementations of a CMUX, CMUX-A and CMUX-B, depicted in FIGS. 2(a) and 2(b), respectively. Both circuits implement Conditions (1)-(4) and invert the output. The difference is that while CMUXA is a conservative implementation that requires 10 transistors, CMUX-B needs only 8 transistors, but has a slightly higher peak current under Condition (3), i.e., if s=M and a=b.

CMUX-A is depicted in FIG. 22(a). A simple check confirms that it—up to inversion of the output signal—behaves as desired if all inputs s, a, b are logical 0 or 1, i.e., that it satisfies Conditions (1) and (2).

Condition (3) is also fulfilled, because a transistor with an undefined input voltage produces an undefined output voltage. For the proposed implementation, this implies that if an undefined voltage M between 0 and 1 is applied to a transistor gate, the transistor acts as a resistor of undefined resistance.

So if s=M and a=b=0, there is a low-resistance path from $V_{CC}$ to $\bar{o}$ at the top right of CMUX-A, but only high-resistance paths from GND to $\bar{o}$, so $\bar{o}=1=\bar{a}$. All transistors with voltage M at the gate are bypassed and do not influence the output voltage. CMUX-A behaves symmetrically if s=M and a=b=1: There is a low-resistance path from GND to $\bar{o}$ but none from $V_{CC}$ to $\bar{o}$.

Together, CMUX-A satisfies Conditions (1)-(4). Also, SPICE simulations carried out by the inventors confirm the correct behavior of CMUX-A.

CMUX-B also fulfills Conditions (1) and (2): If all inputs s, a, b are logical 0 or 1, CMUX-B outputs a if s=0 and b if s=1.

Regarding Condition (3), consider the case s=M and a=b. Then transistors with gate input s or $\bar{s}$ act as resistors of undefined resistance, hence, there is a current from $V_{CC}$ to GND on the left of CMUX-B. This results in a higher peak current under s=M.

If a=b=1, there is a low-resistance path from GND to $\bar{o}$, but the path of least resistance from VCC to $\bar{o}$ passes through two undefined resistances. Hence, the output is dominated by its connection to GND. In the case of a=b=0, CMUX-B behaves symmetrically.

Altogether, CMUX-B satisfies Conditions (1)-(4), but has a higher peak current than CMUX-A under Condition (3). SPICE simulations by the inventors confirm the correct behavior and peak current of CMUX-B.

Figure 23:
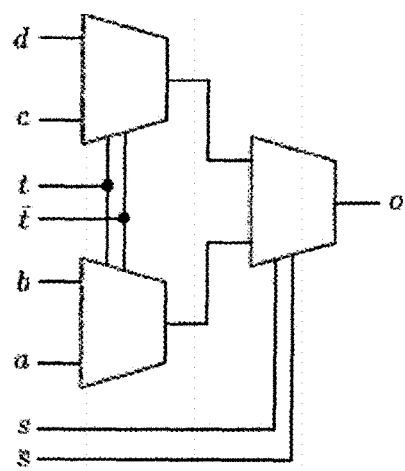
FIG. 23: shows a 4-CMUX assembled from three 2-CMUXes according to an embodiment of the invention.

FIG. 23 shows a 4-CMUX assembled from three 2-CMUXes according to an embodiment of the invention.

It uses two select bits to choose one of four inputs, a generalization of Conditions (1)-(4). It behaves as follows:

| s\t | 0 | 1 | M |
|---|---|---|---|
| 0 | a | b | a*b |
| 1 | c | d | c*d |
| M | a*c | b*d | a*b*c*d | where x*y is an unspecified output voltage if x≠y, but x*y=x if x=y [4].

This two-level approach negates the output twice and hence directly produces the desired input. Together with four transistors to invert both select bits, it requires 3·8+4=28 transistors to implement a 4-CMUX from CMUX-B (3·10+4=34 when taking CMUX-A as basis).

FIG. 24 shows a number of transistors saved when using CMUX-B instead of the 4-CMUX of FIG. 23.

When sorting 2-bit numbers, using the CMUX-B saves 55.6% of the transistors. Due to the quadratic dependency of the circuit complexity on B, the savings become even more drastic when increasing B: using CMUX-B saves 83.9% of the transistors when sorting 16-bit numbers.

We claim:

1. A method for synchronizing a number of clock pulses, the method comprising:
    for each clock pulse, translating incoming clock signal transitions to a binary value encoding a deviation from an expected arrival time;
    selecting a first binary value and a second binary value;
    calculating an average of these values and computing its difference to the expected value; and
    applying a corresponding phase correction or clock shift.

2. The method of claim 1, further comprising the step of correcting a frequency of one or more of the pulse signals.

3. The method of claim 1, characterized in that the incoming clock signal transitions are translated by a multiplexed time-to-digital converter (TDC).

4. The method of claim 1, wherein ring-oscillator TDCs are used and wherein a control bit is used for indicating on which side of the oscillator ring the oscillator was halted by the incoming signal.

5. The method of claim 2, wherein two relevant signals are selected before feeding the signals into the TDC, using a sorting network.

6. The method of claim 3, wherein approximate frequency measurements are obtained from a single measurement of phase differences.

7. The method of claim 1, wherein a node is accelerated if it observes fewer then n−f signals in a local time window.

8. Metastability-containing electronic circuit, usable for synchronizing a number of clock pulses, the circuit comprising:
    inputs, constructed and adapted to receive one or more electrical input signals;
    combinational logic constructed and adapted to generate one or more electrical output signals, based on the one or more input signals; and
    outputs, constructed and adapted to output the one or more output signals;
    wherein
    the combinational logic generates at least one stable output signal (0, 1), based on at least one combination of stable and metastable input signals (0, 1, M), and wherein
    at least two input signals are clock pulses and at least one output signal represents a clock difference between the input signals, and wherein
    the combinational logic encodes the clock difference in a binary reflected Gray code (BRCG).

9. The circuit according to claim 8, wherein the combinational logic is a multiplexer.

10. The circuit according to claim 9, wherein an AND gate checks whether the inputs are equal and feeds its result into an OR gate.

11. The circuit according to claim 8, wherein a circuit sorting two B-bit gray code inputs with possibly one metastable bit each are obtained by using a recursive approach whose size and depth are $O(b^2)$ and $O(b)$ respectively.

12. The circuit according to claim 8, wherein the combinational logic selects one of the input signals.

13. The circuit according to claim 8, wherein at least one input signal is delayed and the combinational logic generates the output signals, based on the delayed input signal.

14. The circuit according to claim 8, wherein the combinational logic is a sorting network.

15. The circuit according to claim 8, further comprising a digitally controlled oscillator (DCO), controlled by at least one of the output signals.

16. Metastability-containing electronic circuit, usable for synchronizing a number of clock pulses, the circuit comprising:
    inputs, constructed and adapted to receive one or more electrical input signals;
    combinational logic constructed and adapted to generate one or more electrical output signals, based on the one or more input signals; and
    outputs, constructed and adapted to output the one or more output signals, wherein
    the combinational logic generates at least one stable output signal (0, 1), based on at least one combination of stable and metastable input signals (0, 1, M), and wherein
    the circuit comprises a sorting circuit sorting two B-bit gray code inputs with possibly one metastable bit each, the sorting circuit obtained by using a recursive approach whose size and depth are O(b2) and O(b) respectively.

17. The circuit according to claim 16, wherein the combinational logic comprises a multiplexer.

18. The circuit according to claim 16, wherein at least one input signal is delayed and the combinational logic generates the output signals, based on the delayed input signal.

19. The circuit according to claim 16, wherein the combinational logic comprises a sorting network.

20. The circuit according to claim 16, further comprising a digitally controlled oscillator (DCO), controlled by at least one of the output signals.

* * * * *